(12) United States Patent
Schrödinger

(10) Patent No.: US 6,833,802 B1
(45) Date of Patent: Dec. 21, 2004

(54) CONTROLLABLE ELECTRICAL RESISTOR

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/454,921

(22) Filed: Jun. 5, 2003

(51) Int. Cl.[7] .............................................. H03M 1/78
(52) U.S. Cl. ........................................ 341/154; 341/141
(58) Field of Search ................................. 341/154, 144, 341/155, 141, 137, 138

(56) References Cited

U.S. PATENT DOCUMENTS

| | | | | |
|---|---|---|---|---|
| 4,132,985 A | * | 1/1979 | Kitaura | 341/164 |
| 4,554,671 A | * | 11/1985 | Collins | 375/249 |
| 5,631,648 A | * | 5/1997 | Yamada et al. | 341/138 |
| 5,774,083 A | * | 6/1998 | Flynn | 341/118 |
| 6,307,490 B1 | * | 10/2001 | Litfin et al. | 341/121 |
| 6,693,491 B1 | * | 2/2004 | Delano | 330/282 |

* cited by examiner

*Primary Examiner*—Peguy JeanPierre
(74) *Attorney, Agent, or Firm*—Laurence A. Greenberg; Werner H. Stemer; Ralph E. Locher

(57) ABSTRACT

The invention is based on the object of specifying a controllable resistor network which exhibits a wide dynamic range and at the same time only a small relative resistance increment size.

According to the invention, this object is achieved by a controllable resistor network (40) in which the respective resistance value of the resistor network can be selected from a predetermined group of discrete resistance values by means of control signals (XXX, YYY) which can be applied to the resistor network, the graduation of the resistance values exhibiting a logarithmic or quasi-logarithmic characteristic.

22 Claims, 5 Drawing Sheets

FIG 2

| MSB--> | 000 | 001 | 010 | 011 | 100 | 101 | 110 | 111 |
|---|---|---|---|---|---|---|---|---|
| LSB | Rges | Rges | Rges | Rges | Rges | Rges | Rges | Rges |
| 000 | 700 | 1322 | 2498 | 4718 | 8911 | 16832 | 31793 | 60054 |
| 001 | 778 | 1469 | 2775 | 5242 | 9901 | 18702 | 35326 | 66727 |
| 010 | 856 | 1616 | 3053 | 5766 | 10891 | 20572 | 38859 | 73399 |
| 011 | 933 | 1763 | 3330 | 6290 | 11881 | 22442 | 42391 | 80072 |
| 100 | 1011 | 1910 | 3608 | 6814 | 12871 | 24313 | 45924 | 86745 |
| 101 | 1089 | 2057 | 3885 | 7338 | 13861 | 26183 | 49456 | 93418 |
| 110 | 1167 | 2204 | 4163 | 7863 | 14852 | 28053 | 52989 | 100090 |
| 111 | 1244 | 2351 | 4440 | 8387 | 15842 | 29923 | 56522 | offen |

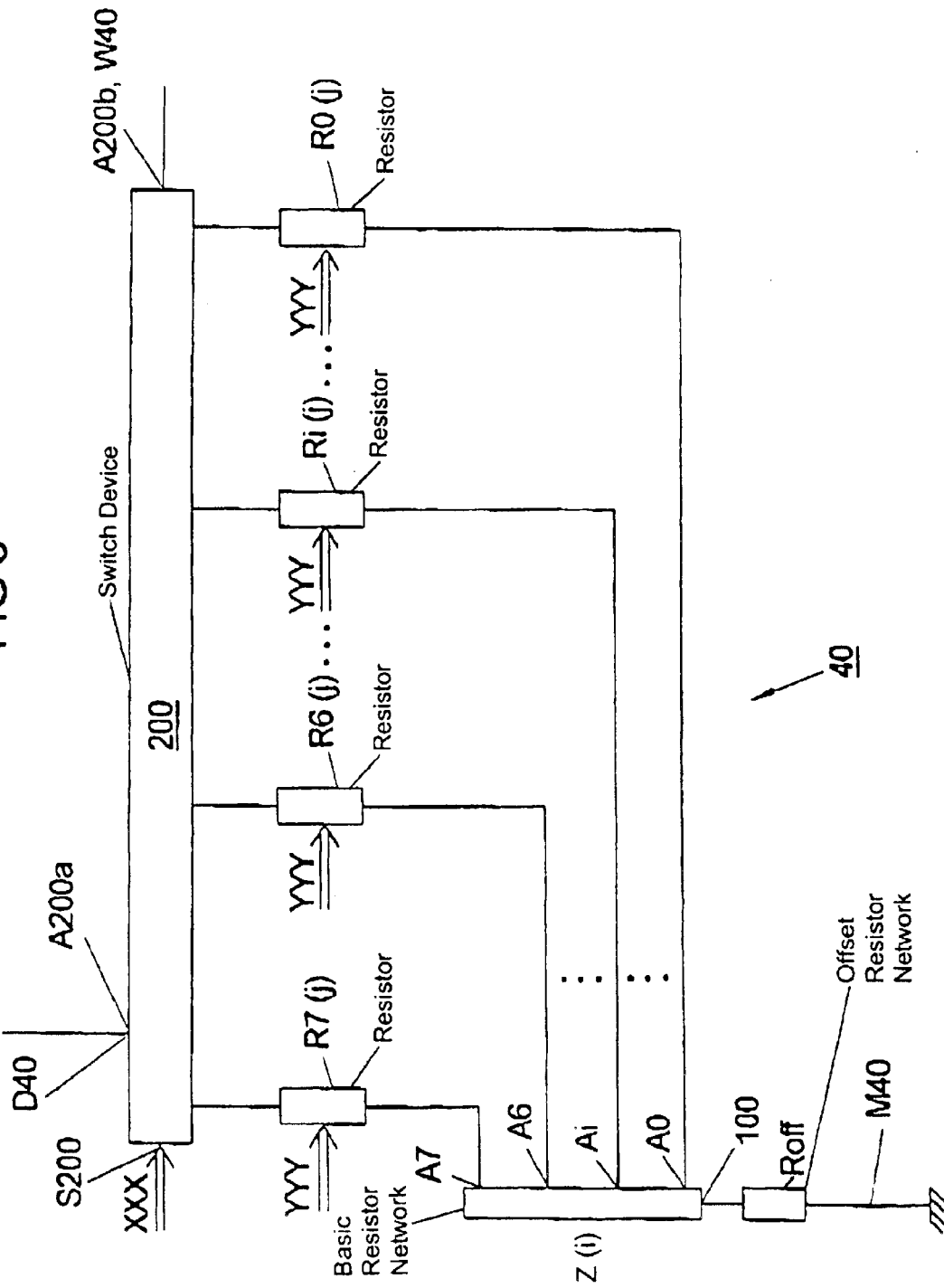

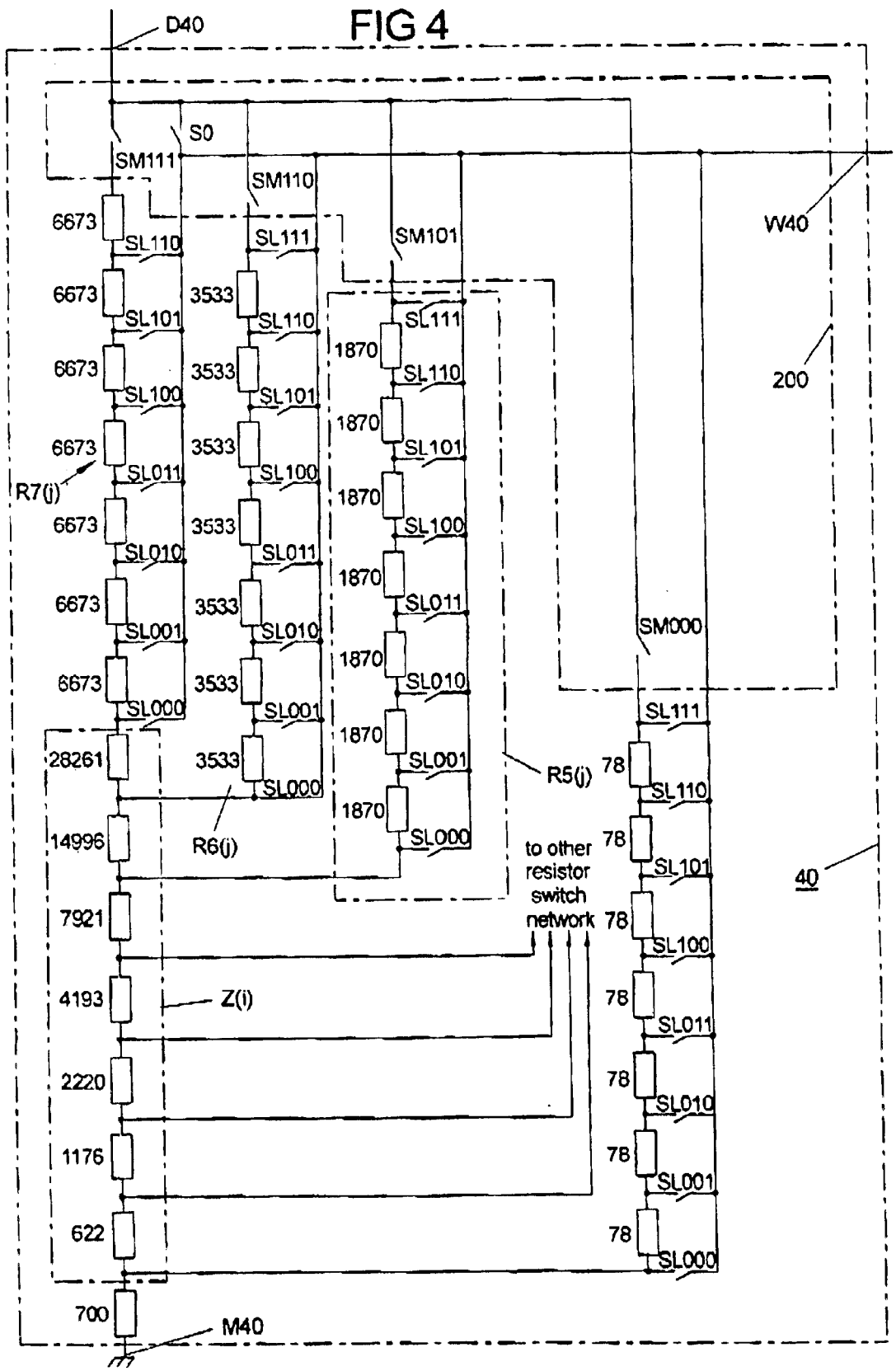

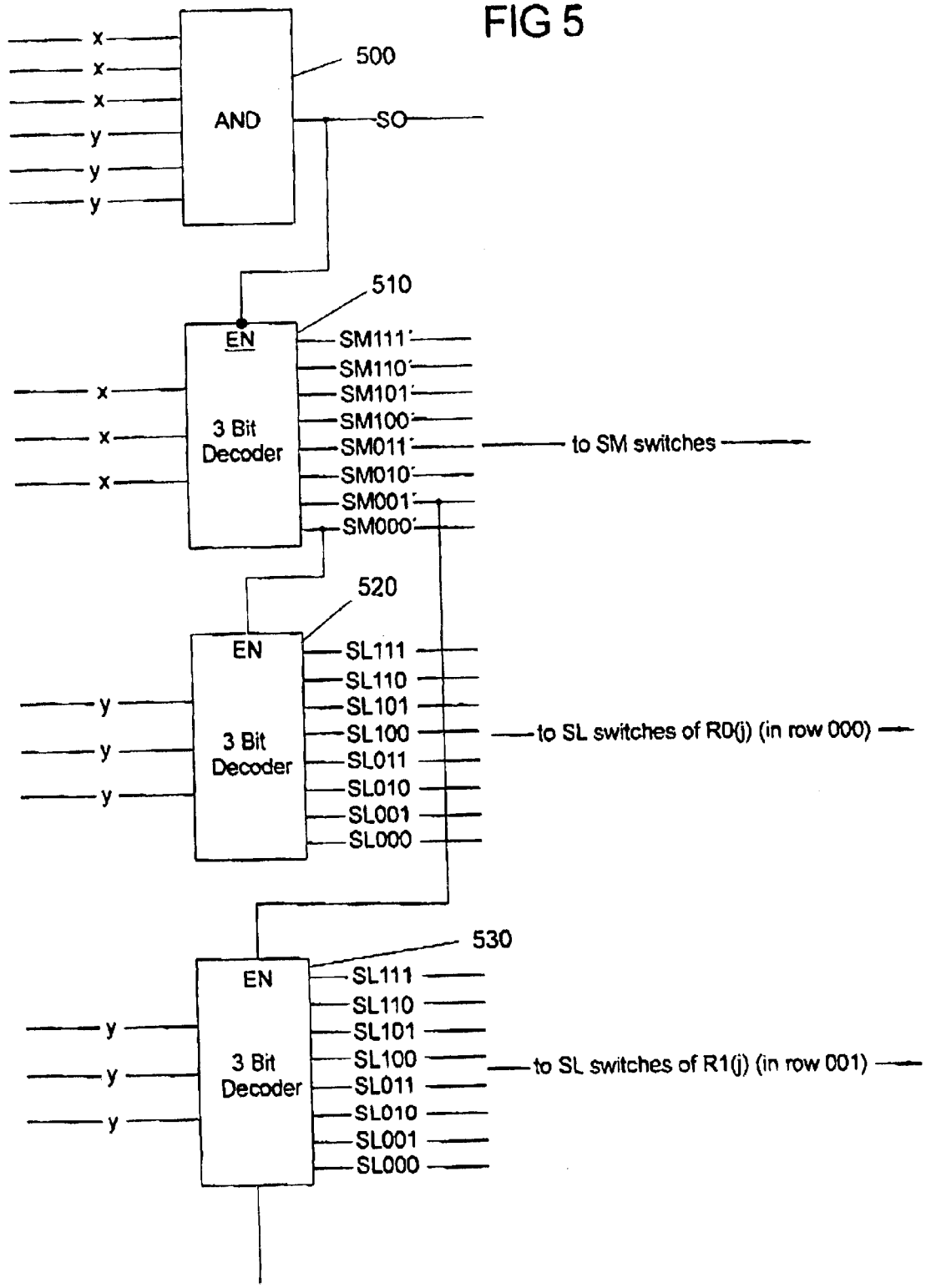

CONTROLLABLE ELECTRICAL RESISTOR

BACKGROUND OF THE INVENTION

Field of the Invention

The invention is based on the object of specifying a controllable resistor network which has a wide dynamic range and, at the same time, only a small relative resistance increment size.

SUMMARY OF THE INVENTION

Accordingly, according to the invention, a controllable resistor network is provided in which the respective resistance value of the resistor network can be selected from a predetermined group of discrete resistance values by means of control signals (XXX, YYY) which can be applied to the resistor network, the graduation of the resistance values exhibiting a logarithmic or a quasi-logarithmic characteristic.

An essential advantage of the controllable resistor network according to the invention consists in that a relatively wide dynamic range is achieved due to the logarithmic or quasi-logarithmic characteristic of the resistance graduation.

A second essential advantage of the resistor network according to the invention consists in that, due to the logarithmic or quasi-logarithmic characteristic of the resistance graduation, an extremely small number of control signals or control bits is required. This is associated with the fact that, in the resistor network according to the invention, the number of required switching elements or of required control lines is also small.

According to an advantageous development of the controllable resistor network, it is provided that the resistance values are graduated in such a manner that they form a predetermined number of resistance intervals having in each case the same number of resistance values. The resistance values within their respective resistance interval increase linearly or logarithmically; the resistance ranges covered by the resistance intervals in each case, in contrast, increase logarithmically toward rising resistance values. A first group of control signals selects the respective resistance interval and a second group of control signals determines one of the resistance values of the resistance interval selected in each case.

A first advantage of the advantageous development of the resistor network consists in that a relatively wide dynamic range is achieved due to the logarithmic increase or growth in resistance intervals.

A second advantage of the advantageous development of the resistor network can be seen in the fact that, in spite of the relatively wide dynamic range, a relatively small resistance increment size is achieved; in the resistor network according to the invention, this is actually achieved due to the fact that the increase in resistance within the respective resistance intervals is linear or also logarithmic.

A third advantage of the advantageous development of the resistor network consists in that, due to the resistance graduation, an extremely small number of control signals or control bits is required. This is associated with the fact that, in the resistor network according to the invention, therefore, the number of required switching elements or of required control lines is also small.

A fourth advantage of the resistor network is that the voltage over the total resistor is smaller than a factor of the two with respect to the selected resistor value.

The control signals used for driving can be advantageously, for example, control bits, that is to say digital binary control signals.

In a particularly simple and thus advantageous manner, the minimum resistance values of the respective resistance intervals can be formed with the aid of a programmable basic resistor network, the resistance value of which is determined by the first group of control signals or control bits, respectively.

The resistance values of the programmable basic resistor network, which can be determined by the first group of control signals or control bits, are preferably logarithmically graduated.

In a particularly simple and thus advantageous manner, a logarithmic graduation of the resistance values of the basic resistor network can be achieved if the basic resistor network is formed by a series connection of at least two series resistors which are logarithmically graduated.

The determination of the resistance value of the basic resistor network or, respectively, the selection of the series resistors of the series circuit of the basic resistor network can be effected in a simple and thus advantageous manner by means of a switch device which is associated with the basic resistor network. The switch device determines which of the series resistors of the series circuit are active and which are inactive by means of its switch position which is determined by the first group of control signals or control bits. The switch device thus determines the resultant resistance value of the basic resistor network.

In addition, it is considered to be advantageous if the controllable resistor network has at least two additional resistors, a single one of which is always selected by the first group of control bits. These additional resistors can then be used for ensuring the linear graduation according to the invention of the resistance elements within the respective resistance interval.

The resistance value of the additional resistor selected in each case is preferably determined by the second group of control bits.

In a particularly simple and thus advantageous manner, the at least two additional resistors can be formed in each case by a series circuit of auxiliary resistors.

The auxiliary resistors of one and the same additional resistor preferably have in each case the same resistance value in order to ensure a linear graduation of the resistance values of the additional resistors.

To produce a logarithmic graduation of the resistance intervals with respect to one another, the auxiliary resistors are logarithmically graduated from additional resistor to additional resistor.

In a particularly simple and thus advantageous manner, the resistance values of the additional resistors can be adjusted if the additional resistors are allocated switches, the switch position of which is determined by the second group of control signals or control bits and which determine which of the auxiliary resistors of the series circuit are to be active and which are to be inactive.

The additional resistors are preferably in each case connected to the switch device which selects the respective additional resistor in accordance with the first group of control signals or control bits.

The total resistance of the controllable resistor network is preferably formed by the resistance sum of the resistance value of the additional resistor selected in each case and of the resistance value of the basic resistor network.

Such a resistance sum can be formed in a simple and thus advantageous manner by series-connecting the basic resistor network and the additional resistor selected in each case.

If the controllable resistor network is intended to have a minimum resistance which is independent of the control signals or control bits, it is considered to be advantageous if the controllable resistor network has a minimum resistance or offset resistance which is connected in series with the basic resistor network and the additional resistor selected in each case.

In addition, the invention relates to a device for driving a light-emitting element, in particular a laser comprising a controllable resistor network.

With respect to such a device, the invention is based on the object of achieving that the device has a wide dynamic range and, at the same time, only a small drive increment size.

According to the invention, this object is achieved by the fact that the device exhibits a controllable resistor network according to the invention as explained.

With respect to the advantages of the device according to the invention for driving a light-emitting element, reference is made to the above statements relating to the advantages of the controllable resistor network according to the invention, since the advantages of the device according to the invention for driving the light-emitting element correspond to the advantages of the controllable resistor network according to the invention.

BRIEF DESCRIPTION OF THE DRAWINGS

FIG. 2 shows a table with resistance values of the controllable resistor network according to FIG. 1, FIG. 3 shows a block diagram of the controllable resistor network according to FIG. 2, FIG. 4 shows the electrical circuit diagram of the controllable resistor network according to FIGS. 2 and 3 in detail and FIG. 5 shows an exemplary embodiment of a logic circuit or decoding circuit of the controllable resistor network according to FIGS. 1 to 4.

DESCRIPTION OF THE PREFERRED EMBODIMENTS

Figure 1:
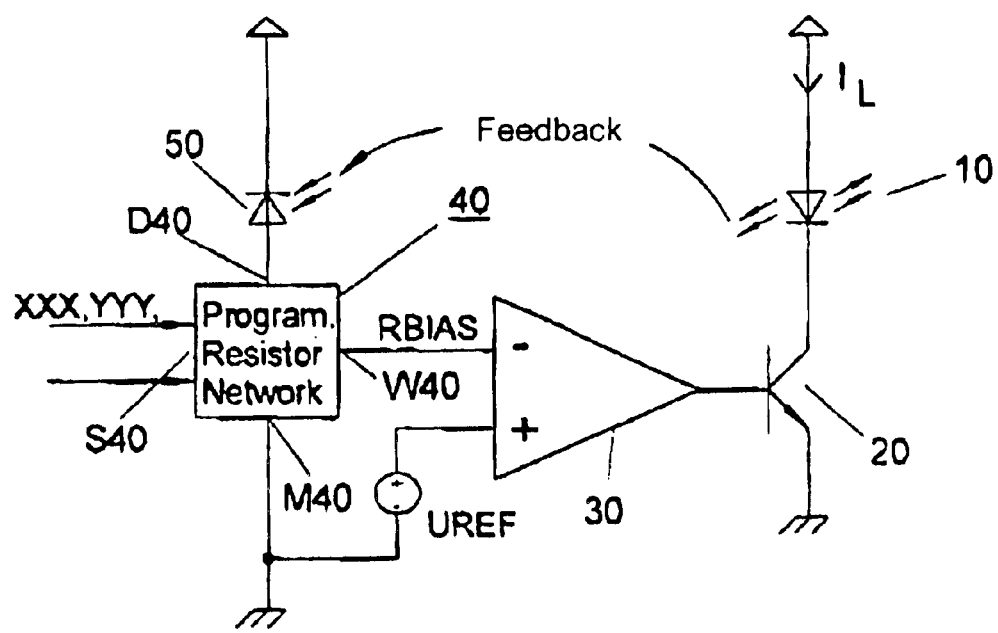
FIG. 1 shows an exemplary embodiment of a device for driving a laser with an exemplary embodiment of a controllable resistor network according to the invention.

FIG. 1 shows a laser 10 which is driven with a laser current $I_L$. The laser current $I_L$ is controlled by a transistor 20, the emitter of which is connected to ground.

The base terminal of transistor 20 is connected to an output of an operational amplifier 30, to the positive input of which a reference voltage Uref is applied. The negative input of the operational amplifier 30 is connected to a controllable resistor network 40.

The resistance value of the controllable resistor network 40 is determined by three control bits XXX (MSB—most significant bits) and by three control bits YYY (LSB—least significant bits) which are applied to a control input S40. The resistor network 40 can be switched off with a control bit combination of MSB=111 and LSB=111 so that the negative input of the operational amplifier 30 is directly connected to terminal D40.

"Switching off" the resistor network 40 can be considered, for example, if, instead of the resistor network 40, a separate resistor network is to be connected to the negative input of the operational amplifier 30.

The controllable resistor network 40 is connected to ground with a ground terminal M40 and is connected to a monitor diode 50 of the laser 10 by means of a terminal D40. Because of its connection to the monitor diode D40, the terminal D40 will be called "monitor diode terminal" D40 by way of example in the text which follows.

The resistance values of the controllable resistor network 40 according to FIG. 1 are listed by way of example in the table in FIG. 2. The MSB control bits XXX are listed in the direction of the rows and the LSB control bits YYY are listed in the direction of the columns. For each of these control bit combinations MSB and LSB, respectively, the resultant resistance Rtot at the resistance terminal W40-M40 of the controllable resistor network 40 is entered in the table.

FIG. 3 shows an exemplary embodiment of the controllable resistor network 40 according to FIG. 1 in a block diagram (schematic drawing).

FIG. 3 shows a basic resistor network Z(i) which is connected with a terminal 100 to a terminal of an offset resistor network Roff. The other terminal of the offset resistor network Roff is connected to ground.

The basic resistor network Z(i) also has other terminals Ai (i=0 to 7) which are in each case connected to an additional resistor network Ri(j) (i=0 to 7). For reasons of clarity, only the additional resistors R7(j), R6(j) and R0(j) are explicitly drawn in FIG. 3. For the remaining additional resistors R1(j) to R5(j), an additional resistor Ri(j) (i=1 to 5) is shown as an equivalent.

The additional resistors Ri(j) (i=0 to 7) are connected to a switch device 200, one terminal A200a of which forms the diode terminal D40 of the controllable resistor network 40 and the other terminal A200b of which forms the resistance terminal W40 of the controllable resistor network 40 (compare FIG. 1).

The control bits XXX and YYY are present at a control input S200 of the switch device 200. The control bits YYY are also present at the additional resistors II(j) (i=0 to 7) and determine the resistance value of the respective additional resistor Ri(j).

The variables i and j designate the decimal numbers which are defined by the MSB control bits XXX and the LSB control bits YYY, respectively. The numbers i and j thus form natural numbers between 0 and 7 and only represent a short and compact notation for the binary numbers formed by the control bits XXX and YYY. The MSB control bits XXX determine the value for i and the LSB control bits determine the value for j.

The MSB control bits XXX present at the switch device 200 select the respective additional resistor Ri(j) (Ri(y) in binary notation is: $R_{xxx}$(YYY)), and thus the current path to the basic resistor network Z(i). Depending on the selected current path, the current then flows from the monitor diode terminal D40 to the terminal Ai (i=0 to 7) selected in each case, of the basic resistor network Z(i) (Z(i) in binary notation is Z(XXX)). These will now be illustrated by means of three examples:

If, for example, the MSB bits have the bit sequence "000", this corresponds to the decimal number i=0 so that additional resistor R0(j) is selected and the current flows to terminal A0.

If the MSB bits have the bit sequence "011", this corresponds to the decimal number i=3 so that the additional resistor R3(j) is selected and the current flows to terminal A3.

If the MSB bits have, for example, the bit sequence "110", this corresponds to the decimal number i=6 so that the additional resistor R6(j) is selected and the current flows to terminal A6.

The numbers i and j also indicate in FIG. 3 that the MSB control bits XXX both determine the resistance value of the basic resistor network Z(i) and select the active additional resistor Ri(j) in each case. The LSB control bits YYY, in contrast, only determine the resistance value of the selected additional resistor Ri(j).

In summary, it can be said that the total resistance formed by the controllable resistor network 40 according to FIG. 3 is formed by the sum of the basic resistor network Z(r), the offset resistor network Roff and the additional resistor Ri(j) selected in each case. Thus, the total resistance value of the controllable resistor network 40 can be set by applying the corresponding control bits XXX and YYY, respectively, to the controllable resistor network 40.

FIG. 4 shows the controllable resistor network 40 according to FIG. 3 in detail. It shows the basic resistor network Z(i) which is formed by the series circuit of the resistors having reference designations 622, 1176, 2220, 4193, 7921, 14996 and 28261.

The reference designations of the resistors in each case also specify the associated resistance value in ohms; this means that, for example, the resistor having reference designation 4193 has a resistance value of 4193 ohms. This correspondingly applies to the remaining resistors.

In addition, FIG. 4 shows the additional resistors Ri(j) which are in each case formed by a series circuit of auxiliary resistors. Thus, for example, resistor R7(j) has auxiliary resistors 6673 which in each case form a resistance value of 6673 ohms.

The additional resistor R6(j) is formed by a series circuit of the auxiliary resistors having the resistance values of in each case 3533 ohms. Resistor R5(j) is formed by auxiliary resistors having the resistance values of in each case 1870 ohms. The additional resistor R0(j) has auxiliary resistors having resistance values of in each case 78 ohms.

The additional resistors R1(j) to R4(j) are not shown in FIG. 4 for the sake of clarity. The auxiliary resistors of all additional resistors Ri(j) (i=0 to 7) are, therefore, listed in the table below:

| Additional resistor: | Auxiliary resistors: |
|---|---|
| R0 (j) | 78 ohm |
| R1 (j) | 147 ohm |
| R2 (j) | 278 ohm |
| R3 (j) | 524 ohm |
| R4 (j) | 990 ohm |
| R5 (j) | 1870 ohm |
| R6 (j) | 3533 ohm |
| R7 (j) | 6673 ohm |

Each of the additional resistors Ri(j) is in each case allocated switches SLYYY (SL000 to SL111), the switch position of which determines which of the auxiliary resistors of the additional resistor are in each case active and which are not. Of the switches SLYYY, in each case, at the most a single switch is always closed—which correspondingly applies to switches SMXXX; the remaining switches are open. This will be explained in detail with the example of the additional resistor R5(j):

The partial resistance of the series circuit formed of the auxiliary resistors 1870 which is picked up at the output W40 of the controllable resistor network is determined by which of the switches SL000 to SL111 is short-circuited. The additional resistor R6(j) is selected by the switch SM110 which forms a switch of the switch device 200.

In addition, the switch device 200 has further switches SM000 to SM111 by means of which each of the remaining additional resistors Ri(j) can also be selected.

With respect to terminal W40 of the controllable resistor network 40, control bits XXX and YYY can thus be used for setting the output resistance which is to be formed by the controllable resistor network 40 at the negative input of the operational amplifier 30 according to FIG. 1.

As can also be seen from FIG. 4, terminal D40 is connected to the switch device 200 in such a manner that the resistance of the controllable resistor network 40, which occurs at the monitor diode terminal D40, is exclusively determined by the MSB control bits XXX which determine the switch positions of the switches SMXXX (SM000, . . . , SM111).

With respect to the monitor diode terminal D40, the resistance of the controllable resistor network 40 is thus independent of the LSB control bits YYY which determine the position of the switches SL000 to SL111 of the additional resistors Ri(j).

The selection of the resistance value of the controllable resistor network 40 thus requires a total of six control bits, namely the LSB control bits and the. MSB control bits. These control bits are in each case used for selecting a resistance value from the table according to FIG. 2:

1. MSB Control Bits

The MSB control bits in each case select a column according to the table in FIG. 2 via switches SM000 to SM111 of the switch device 200.

2. LSB Control Bits

The LSB control bits YYY determine the switch positions of the eight switches SLYYY (SL000 to SL111) and by this means in each case a resistance tap is selected at the selected additional resistor Ri(j). This tap then determines the resistance value Rtot which is selected in the column in the table according to FIG. 2, which is determined by the MSB control bits.

As can be seen from the table according to FIG. 2, a quasi-logarithmic resistance programming is possible in the resistor network in the controllable resistor network 40 according to FIG. 4.

The resistance increments are between about 5 and 10%, which corresponds to optical power increments in the drive circuit according to FIG. 1 from 0.2 to 0.5 dB.

If the controllable resistor network 40 or, respectively, the resistor network according to FIG. 4, is used in the drive circuit according to FIG. 1, no significant current flows via the resistance input W40 of the controllable resistor network 40 since the operational amplifier 30 has a high impedance at its negative input.

For this reason, no or no significant current flows via the switches SLYYY (SL000 to SL111), normally implemented by transistors, either; these switches thus have no influence on the control loop of the drive circuit according to FIG. 1 and, therefore, can be dimensioned to be very small.

The voltage drop of the switches SMXXX (SM000 to SM111), normally also implemented by transistors, is not relevant for the control loop formed by the drive circuit according to FIG. 1 either, since it only includes the voltage drop to ground. The additional voltage drop towards the monitor diode 50 is non-critical since this monitor diode 50 represents a "current source" which operates largely independently of the voltage drop across the controllable resistor network 40. Furthermore, the voltage drop can be adjusted correspondingly by correspondingly dimensioning the resistor network in the controllable resistor network 40.

In addition, as already explained above, the total resistance of the controllable resistor network 40 can also be switched off. This is done by switch S0 which is closed when the MSB control bits have the bit sequence "1111" and the LSB control bits have the bit sequence "111".

If switch S0 is closed, all remaining switches SL000 to SL111 and SM000 to SM111 are opened, which is ensured, for example, by a logic circuit or decoding circuit, not shown in FIGS. 3 and 4. The logic circuit can be arranged, for example, inside the switch device 200 according to FIG. 3.

An exemplary embodiment of such a logic circuit or decoding circuit is shown in FIG. 5 and will be explained in detail below. Firstly, the operation of the logic circuit or decoding circuit will be explained quite generally in conjunction with the controllable resistor network according to FIGS. 3 and 4.

To drive or switch the switches SL000 to SL111 and SM000 to SM111 and S0, the control end of the logic circuit is connected to all switches. The drive lines for the switches SM000 to SM111, S0 and SL000 to SL111, required for this purpose, are also not drawn in FIG. 4 for the sake of clarity.

The switches are driven by the logic circuit in such a manner that in each case a single switch of the switches SMXXX and SLYYY is closed and the remaining switches are open (with switch S0 being open). If switch S0 is closed, all switches SMXXX and SLXXX are opened (control bit combination: LSB=111 and MSB=111).

When the controllable resistor network according to FIG. 4 is used, the circuit according to FIG. 1 composes a monitor current of 10 µA to 1.4 mA in the case of a reference voltage of Uref=1V. This resistance configuration also ensures that no higher voltage than 2×Uref occurs at terminal D40 (monitor terminal) (that is to say less than 2V in this case). It can thus be said that the drive circuit containing the controllable resistor network 40 according to FIG. 1 provides for a very wide dynamic range so that different lasers having very different monitor currents can be used.

In addition, only a limited number of control lines or control bits are required because of the combination of a linear resistance graduation and a logarithmic one. Nevertheless, it is possible to achieve the aforementioned relative resistance increment size of only 5 to 10%, as a result of which the optical power increments of 0.2 to 0.5 dB mentioned can be achieved. The tolerance in the power increments is given by the linear characteristic of the resistances in the individual columns.

The controllable resistor network was explained by way of example in connection with the laser drive according to FIG. 1 in the description of the FIGS. 1 to 4. In addition, the controllable resistor network 40 can also be used in other electrical circuits. Terminals W40, D40 and M40 would then be connected to other electrical components, if necessary.

The logic circuit or decoding circuit required for driving the switches and not shown explicitly in FIGS. 3 and 4 can be formed, for example, by separate logic gates (AND, OR gates etc.). Instead, the logic circuit or decoding circuit can also be formed by a microprocessor device which is programmed in accordance with the operation explained above.

FIG. 5 shows an actual embodiment of a suitable logic circuit or decoding circuit:

FIG. 5 shows an AND gate 500 at the input of which control bits XXX and YYY are present. At the output of the AND gate, a control signal S0' is generated which passes to switch S0 according to FIG. 4 and switches on the switch if signal S0' exhibits a logical "1". This is the case exactly when all control bits XXX and YYY exhibit a logical "1". If not, that is to say if the signal S0' exhibits a logical "0", switch S0 is switched off.

The control signal S0' also passes from the AND gate 500 to an inverting ENABLE input EN of a first 3-bit decoder 510. At the input of the 3-bit decoder 510, the control bits XXX are present. The 3-bit decoder 510 has the task of in each case assigning a logical "1" to exactly a single one of its total number of 8 output lines SMXXX' (XXX=000 to 111) depending on the control bits XXX and in each case a logical "0" to the other output lines. The assignment should take place as follows:

| XXX: | Output line with logical "1 |
|------|------------------------------|
| 000  | SM000'                       |
| 001  | SM001'                       |
| 010  | SM010'                       |
| 011  | SM011'                       |
| 100  | SM100'                       |
| 101  | SM101'                       |
| 110  | SM110'                       |
| 111  | SM111'                       |

Output lines SM000' to SM111' are in each case connected to a control input of their associated switch SM000 to SM111 according to FIG. 4 (allocation: output line SMXXX' for switch SMXXX (XXXX=000 to 111).

The switches SM000 to SM111 shown in FIG. 4 are designed in such a manner that they switch on when a logical "1" is present at their control input and are switched off when a logical "0" is present at their control input.

However, the 3-bit decoder 510 is only in operation when a logical "0" (S0'="0") is present at its inverting ENABLE input EN; if not, the 3-bit decoder 510 is inactive and switches all 8 output lines to a logical "0". This ensures that the abovementioned switching-off of the controllable resistor network 40 occurs with a control combination of XXX=111 and YYY=111.

Each of the 8 output lines is in each case connected to an ENABLE input of another 3-bit decoder. In FIG. 5, this is only shown for output lines SM000' and SM001' for reasons of clarity. However, the explanations below also correspondingly apply to the other output lines SM010' to SM111'.

In FIG. 5, the 3-bit decoder connected to output line SM000 carries the reference designation 520. This 3-bit decoder 520 is deactivated as long as output line SM000 exhibits a logical "0". In this case, the 3-bit decoder 520 outputs a logical "0" on all its output lines SL000' to SL111'. This leads to all switches SL000 to SL111 of the additional resistor R0(j), which are connected to output lines SL000' to SL111', are and remain switched off independently of the control bit combination YYY which is present at the input of the 3-bit decoder.

If, in contrast, output line SM000 transmits a logical "1", the 3-bit decoder 520 is activated. In this case, the 3-bit decoder 520 outputs a logical "1" on a single one of its output lines SLYYY', namely on the output line which is determined by the control bit combination YYY present at the input of the 3-bit decoder. A logical "0" is allocated to all remaining output lines SL000' to SL111' apart from the selected output line SLYYY. This leads to only the switch SLYYY of the additional resistor R0(j), which is connected to output line SLYYY', being or remaining switched on; all other switches of the additional resistor R0(j) are switched off.

In FIG. 5, the 3-bit decoder connected to output line SM001 carries the reference designation 530 and operates exactly like the 3-bit decoder 520. The 3-bit decoder 530 is deactivated as long as output line SM001 exhibits a logical "0". In this case, the 3-bit decoder 530 outputs a logical "0" on all its output lines SL000' to SL111'. This leads to all switches SL000 to SL111 of the additional resistor R1(j), which are connected to output lines SL000' to SL111', being or remaining switched off independently of which control bit combination YYY is present at the input.

If, in contrast, output line SM001 transmits a logical "1", the 3-bit decoder 530 is activated. In this case, the 3-bit decoder 530 outputs a logical "1" on a single output line SLYYY', namely on the output line determined by the control bit combination YYY present at the input of the 3-bit decoder. A logical "0" is allocated to all remaining output lines SL000' to SL111'—without SLYYY. This leads to only the switch of the additional resistor R1(j) connected to output line SLYYY' being or remaining switched on; all other switches of the additional resistor R1(j) are switched off.

Switches SL000 to SLll1 of the additional resistors R2(j) to R7(j) according to FIG. 4 are driven correspondingly. For this purpose, a further (constructionally identical) 3-bit decoder is in each case correspondingly connected with its ENABLE input to the 3-bit decoder 510; however, this is not shown in FIG. 5 for reasons of clarity and, therefore, will only be described briefly here:

The ENABLE input of the 3-bit decoder for the additional resistor R2(j) is connected to the output line SM010 of the 3-bit decoder 510. The ENABLE input of the 3-bit decoder for the additional resistor R3(j) is connected to output line SM011 of the 3-bit decoder 510. The ENABLE input of the 3-bit decoder for the additional resistor R4(j) is connected to output line SM100 of the 3-bit decoder 510. The ENABLE input of the 3-bit decoder for the additional resistor R5(j) is connected to output line SM101 of the 3-bit decoder 510. The ENABLE input of the 3-bit decoder for the additional resistor R6(j) is connected to output line SM110 of the 3-bit decoder 510. The ENABLE input of the 3-bit decoder for the additional resistor R7(j) is connected to output line SM111 of the 3-bit decoder 510.

The 3-bit decoders according to FIG. 5 can be formed, for example, by gate circuits consisting, for example, of AND gates, OR gates, etc.

I claim:

1. A configuration, comprising:
   a controllable resistor network including a plurality of resistors for forming a plurality of predetermined discrete resistance values;
   said controllable resistor network configured for obtaining control signals for selecting a particular one of said plurality of resistance values;
   said plurality of resistance values being graduated to form a plurality of predetermined resistance intervals;
   each one of said plurality of predetermined resistance intervals has a group of linearly or logarithmically increasing resistance values;
   each one of said plurality of predetermined resistance intervals has a resistance range that logarithmically increases toward rising resistance values;
   said control signals include a first group of control signals for selecting one of said plurality of predetermined resistance intervals; and
   said control signals include a second group of control signals for selecting a single one of said resistance values of said group in said one of said plurality of predetermined resistance intervals that has been selected by said first group of control signals.

2. The configuration according to claim 1, wherein:
   said group of plurality of resistance values consists of a number of resistance values that is the same in each one of said plurality of predetermined resistance intervals; and
   said controllable resistor network is constructed such that an applied current source induces a voltage over said controllable resistor network that is smaller by a factor of two than a voltage across said one of said resistance values of said group in said one of said plurality of predetermined resistance intervals that has been selected.

3. The configuration according to claim 1, wherein:
   said controllable resistor network includes a basic resistor network that has a plurality of resistance values; and
   said first group of control signals selecting one of said plurality of resistance values of said basic resistor network.

4. The configuration according to claim 3, wherein said plurality of resistance values of said basic resistor network are logarithmically graduated.

5. The configuration according to claim 4, wherein:
   said basic resistor network is formed by a series circuit including at least two resistors connected in series; and
   said resistors of said series circuit have logarithmically graduated resistance values.

6. The configuration according to claim 5, further comprising:
   a switch device allocated to said basic resistor network;
   said switch device having a switch position determined by said first group of control signals; and
   said switch position determining which of said resistors of said series circuit are active and which of said resistors of said series circuit are inactive.

7. The configuration according to claim 1, in combination with a light-emitting element, wherein said controllable resistor network is configured for driving the light-emitting element.

8. The combination according to claim 7, wherein said controllable resistor network includes a resistance terminal for providing the particular one of said plurality of resistance values being selected by said control signals.

9. The combination according to claim 7, further comprising an amplifier circuit having an input connected to said resistance terminal of said controllable resistor network.

10. The combination according to claim 9, wherein said amplifier circuit has an output connected to the light-emitting element.

11. The combination according to claim 9, wherein said amplifier circuit is an operational amplifier circuit.

12. The combination according to claim 7, wherein the light-emitting element is a laser.

13. A configuration, comprising:
   a controllable resistor network including a plurality of resistors for forming a plurality of predetermined discrete resistance values;
   said controllable resistor network configures for obtaining control signals for selecting a particular one of said plurality of resistance values;
   said plurality of resistance values being logarithmically graduated of quasi-logarithmically graduated;
   said control signals include a first group of control signals;

said controllable resistor network has at least two additional resistors;

said first group of said control signals always selects only one of said additional resistors of said controllable resistor network.

14. The configuration according to claim 13, wherein:

said control signals include a second group of control signals;

said one of said additional resistors of said controllable resistor network, which is selected by said first group of said control signals, has a resistance value determined by said second group of said control signals.

15. The configuration according to claim 14, wherein each one of said additional resistors is formed by a series circuit including a plurality of auxiliary resistors connected in series.

16. The configuration according to claim 15, wherein all of said plurality of auxiliary resistors of a particular one of said additional resistors have a resistance value that is the same.

17. The configuration according to claim 15, wherein said plurality of auxiliary resistors of a given one of said additional resistors are logarithmically graduated with respect to said plurality of auxiliary resistors of next larger valued one of said additional resistors.

18. The configuration according to claim 13, wherein:

each one of said additional resistors is formed by a series circuit including a plurality of auxiliary resistors connected in series;

said controllable resistor network includes a plurality of switches allocated to said additional resistors;

said control signals include a second group of control signals;

said plurality of switches have switch positions determined by said second group of said control signals; and said switch positions of said plurality of switches determine which of said plurality of auxiliary resistors of said series circuit are active and which of said plurality of auxiliary resistors of said series circuit are inactive.

19. The configuration according to claim 13, wherein:

said controllable resistor network includes a switch device connected to said additional resistors; and said switch device selects one of said additional resistors in accordance with said first group of said control signals.

20. The configuration according to claim 13, wherein:

said controllable resistor network includes a basic resistor network that has a plurality of resistance values;

said one of said additional resistors being selected has a resistance value; and said particular one of said plurality of resistance values being selected is formed by a sum of a selected one of said plurality of resistance values of said basic resistor network and said resistance value of said one of said additional resistors being selected.

21. The configuration according to claim 20, wherein said basic resistor network and said one of said additional resistors being selected are connected in series.

22. The configuration according to claim 21, wherein said controllable resistor network includes an offset resistor connected in series with said basic resistor network and said one of said additional resistors being selected.

* * * * *